US006101625A

United States Patent [19]
Higashi

[11] Patent Number: 6,101,625
[45] Date of Patent: Aug. 8, 2000

[54] METHOD AND APPARATUS FOR PERFORMING ERROR CORRECTING PROCESS WITH SMALL MEMORY CAPACITY

[75] Inventor: Kunihiko Higashi, Kanagawa, Japan

[73] Assignee: NEC Corporation, Tokyo, Japan

[21] Appl. No.: 09/056,020

[22] Filed: Apr. 6, 1998

[30] Foreign Application Priority Data

May 23, 1997  [JP]  Japan ................................ 9-133148

[51] Int. Cl.[7] .................................................. H03M 13/00
[52] U.S. Cl. .......................................... 714/776; 714/752
[58] Field of Search .................................... 714/752, 758, 714/776, 755

[56] References Cited

U.S. PATENT DOCUMENTS

| | | | |
|---|---|---|---|
| 5,467,361 | 11/1995 | Shipman, Jr. ............................ | 714/769 |
| 5,867,510 | 2/1999 | Steele ...................................... | 714/758 |
| 5,920,581 | 7/1999 | Lang ....................................... | 714/799 |
| 5,969,634 | 10/1999 | Takashima et al. ................ | 340/825.44 |

FOREIGN PATENT DOCUMENTS

| | | |
|---|---|---|
| 1-55788 | 11/1989 | Japan . |
| 2-11184 | 3/1990 | Japan . |
| 3-76612 | 12/1991 | Japan . |
| 08 331078A | 12/1996 | Japan . |

OTHER PUBLICATIONS

Moriyama et al., Performance of an Error Correction Scheme for PAL–TV Teletext, IEEE, pp. 43 to 47, Mar. 1992.
Moriyama et al., Development of an Error Correction System in Teletext for PAL–TV Signals, IEEE, pp. 229 to 233, 1994.
Takada et al. FM Multiplex Broadcasting System "DARC", IEEE, pp. 111 to 116, 1994.
Suka et al., Development of DARC Decoding LIS for High–Speed FM Subcarrier System, IEEE, pp. 570 to 579, Jun. 1994.
"Development of an Error–Correcting Method for Coded Transmission Teletext" NHK Science and Technical Research 1985 pp. 38–67.
T. Koruda, et al., "An Error–Correction Method of FM Multiplex Broadcasting for Mobile Reception", Electronics and Communications in Japan, Part I, Communications, vol. 78, No. 1, Jan. 1995, pp. 82–89; and.
P. Scomazzon, et al., "A High Bit–Rate Broadcasting System Using the Terrestrial FM Radio Network; Swift Eureka, 1997 Project", EBU Technical Review Summer 1995, pp. 4–12.

*Primary Examiner*—Albert De Cady
*Assistant Examiner*—Shelly A Chase
*Attorney, Agent, or Firm*—Scully, Scott, Murphy & Presser

[57] ABSTRACT

In an error correcting system, an error correcting unit stores a subframe data sequentially and circularly in first to third subframe memories. The subframe data is supplied continuously and is subjected to a first row direction error detecting and correcting process. The error correcting unit performs a column direction error detecting and correcting process to first and second subframe data and then performs a second row direction error detecting and correcting process to a part of the first subframe data, while the first row direction error detecting and correcting process is performed to a third subframe data to store in the third subframe memory. Also, the error correcting unit performs the second row direction error detecting and correcting process to a remaining part of the first subframe data and the second subframe data, while the first row direction error detecting and correcting process is performed to a fourth subframe data to store in the first subframe memory from a head location.

18 Claims, 15 Drawing Sheets

Fig. 3A
PRIOR ART
Fig. 3B
PRIOR ART
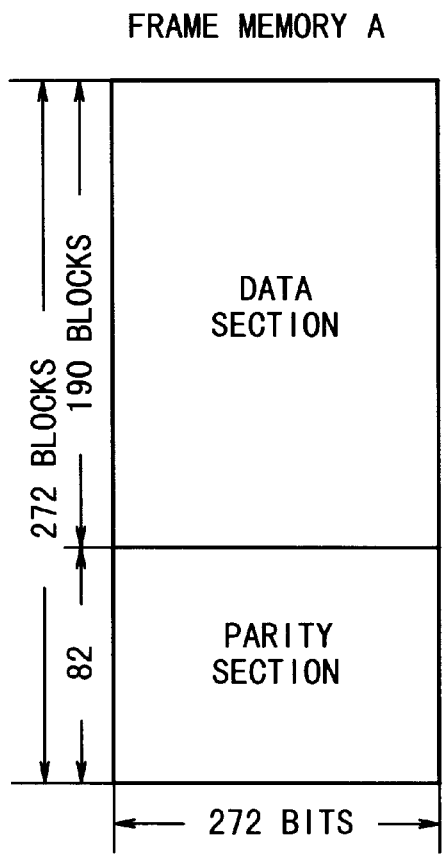
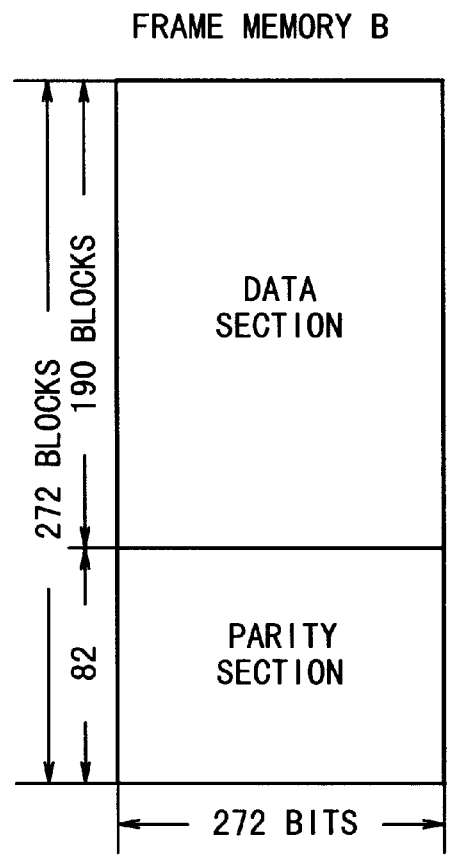

Fig. 4 PRIOR ART

| | | | | |
|---|---|---|---|---|
| 13 BLOCK | BLC1 | PACKET 1 | CRC | PARITY |
| | | ⋮ | | |
| | BLC1 | PACKET 13 | CRC | PARITY |
| 123 BLOCK | BLC3 | PACKET 14 | CRC | PARITY |
| | BLC3 | PACKET 15 | CRC | PARITY |
| | BLC4 | PARITY PACKET 1 | | |
| | | ⋮ | | |
| | BLC3 | PACKET 94 | CRC | PARITY |
| | BLC3 | PACKET 95 | CRC | PARITY |
| | BLC4 | PARITY PACKET 41 | | |
| 13 BLOCK | BLC2 | PACKET 96 | CRC | PARITY |
| | | ⋮ | | |
| | BLC2 | PACKET 108 | CRC | PARITY |
| 123 BLOCK | BLC3 | PACKET 109 | CRC | PARITY |
| | BLC3 | PACKET 110 | CRC | PARITY |
| | BLC4 | PARITY PACKET 42 | | |
| | | ⋮ | | |
| | BLC3 | PACKET 189 | CRC | PARITY |
| | BLC3 | PACKET 190 | CRC | PARITY |
| | BLC4 | PARITY PACKET 82 | | |

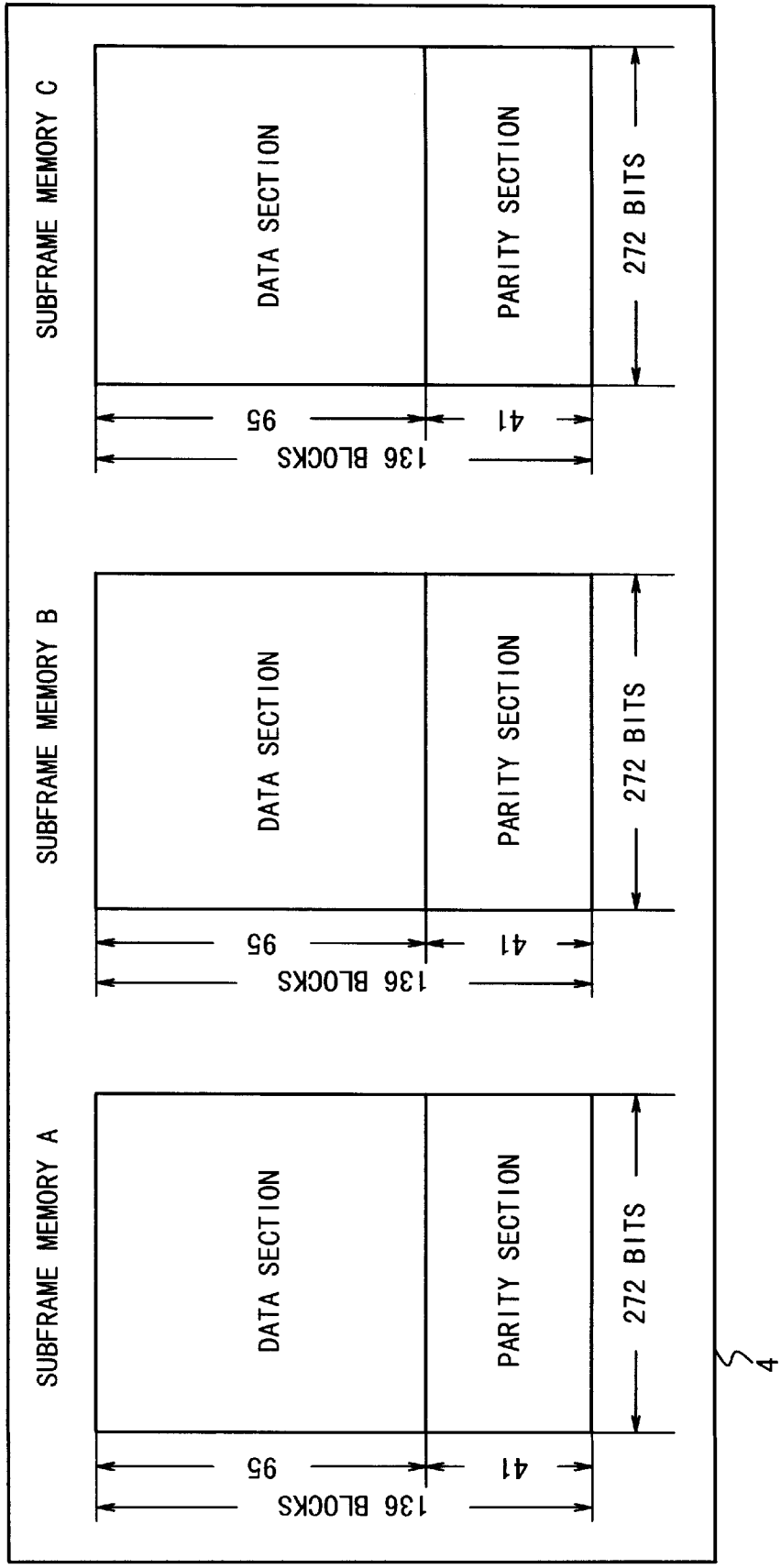

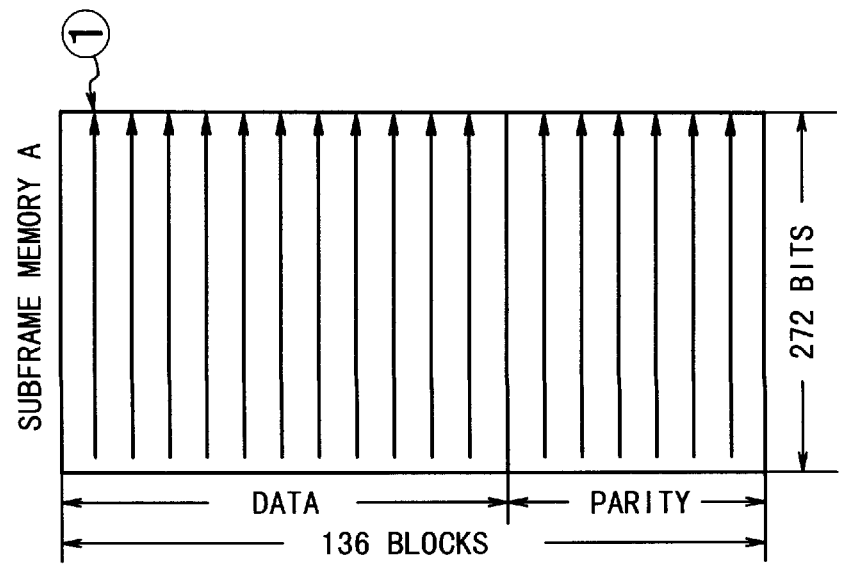
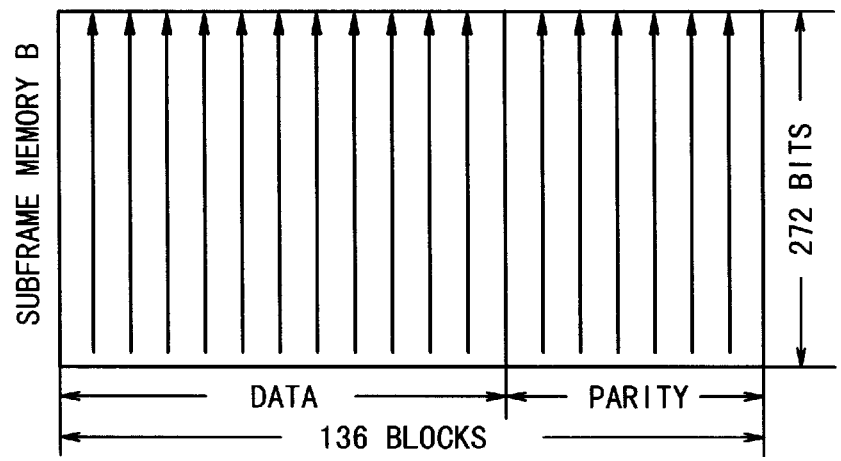
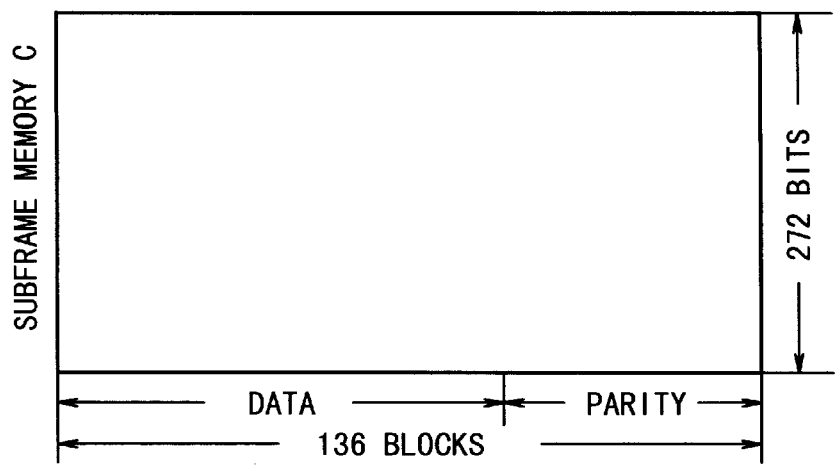

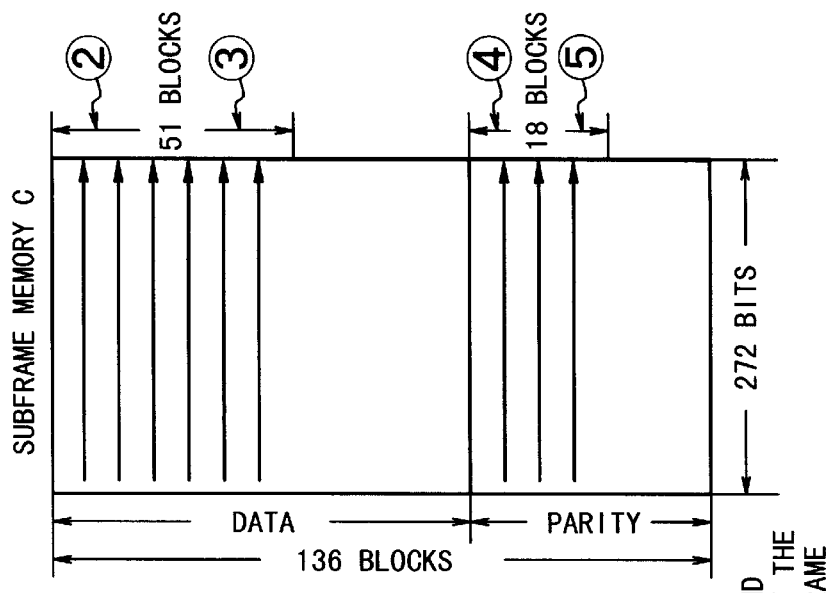
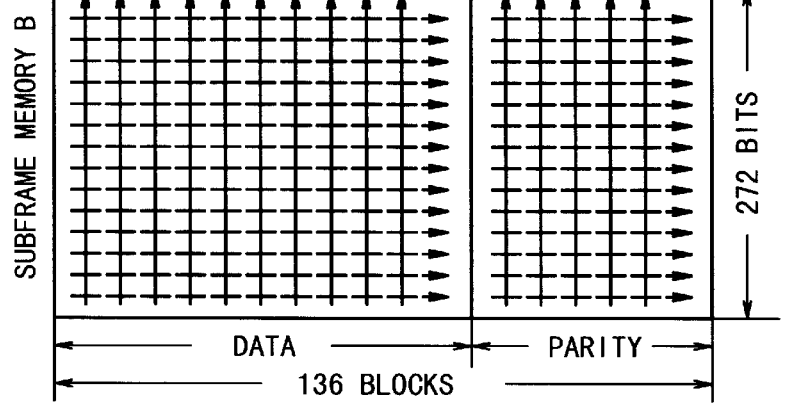
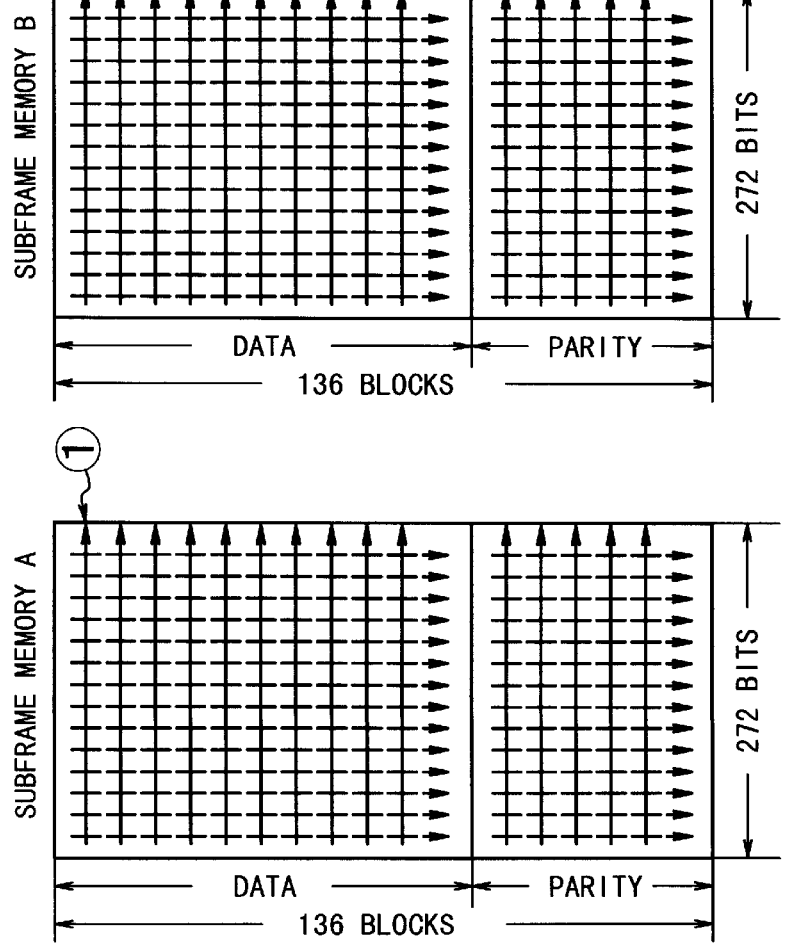

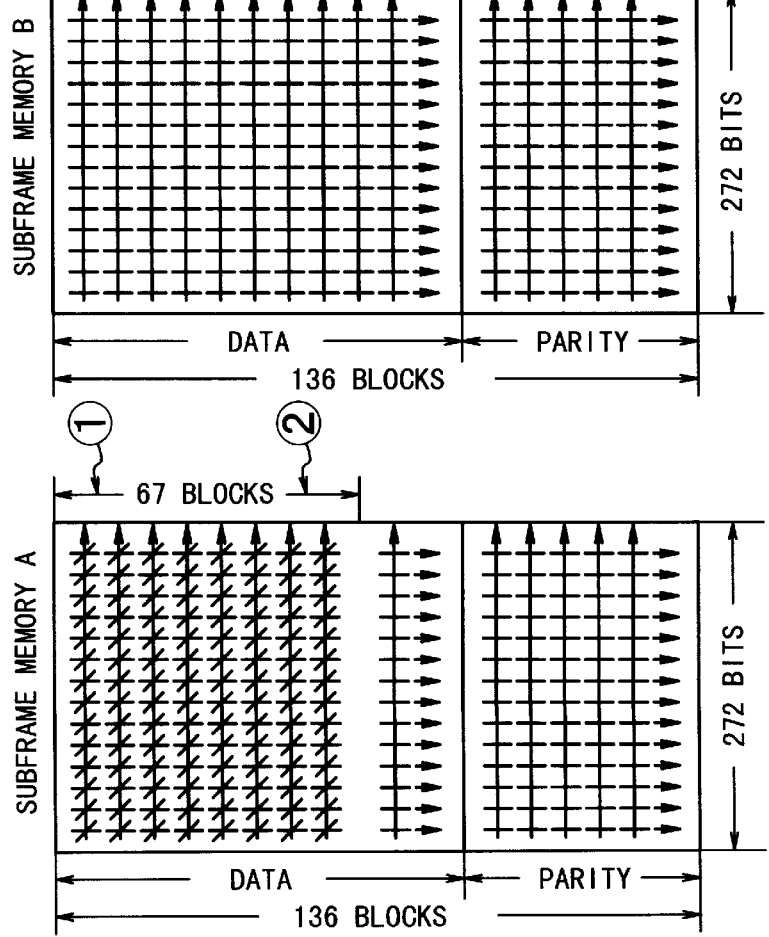

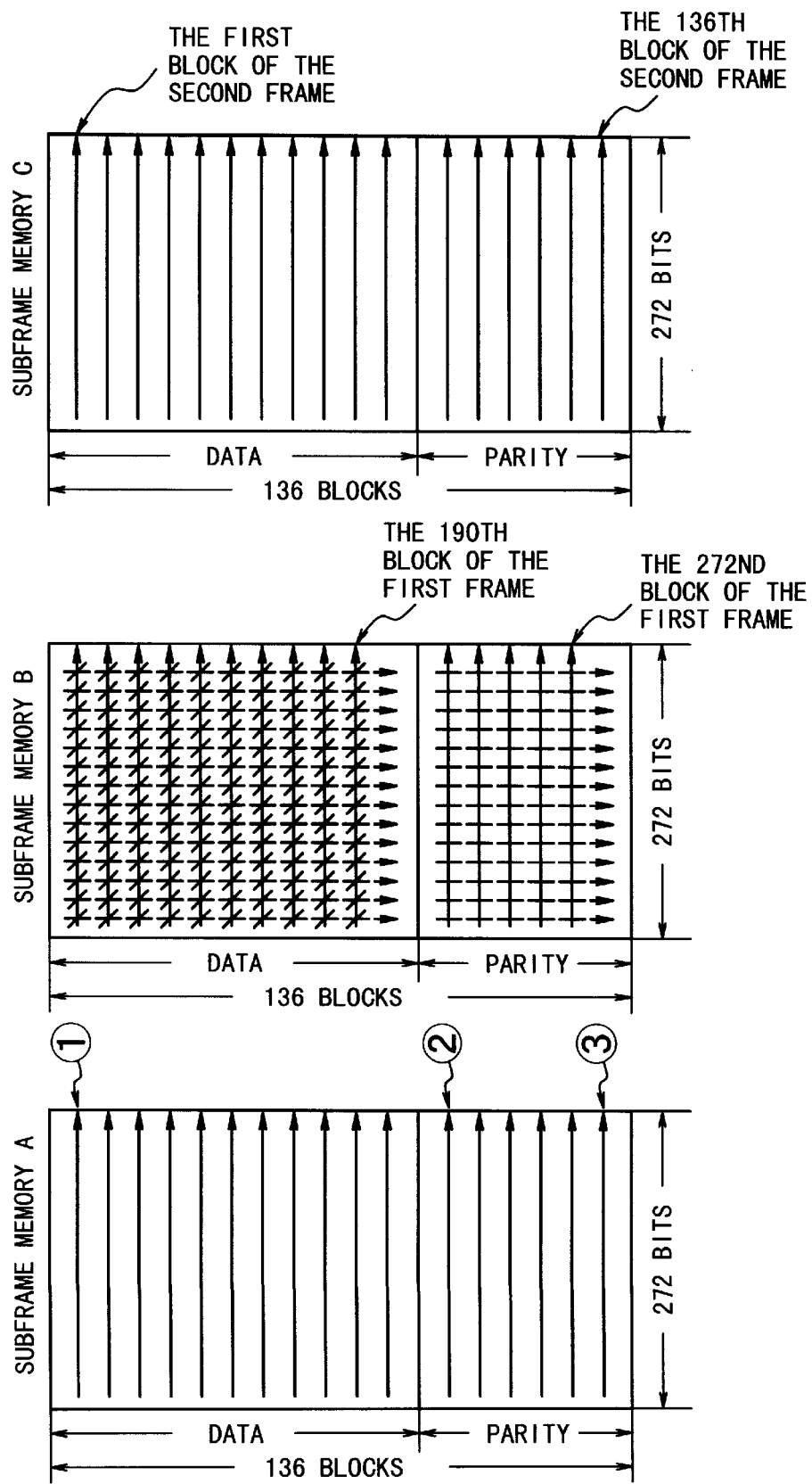

METHOD AND APPARATUS FOR PERFORMING ERROR CORRECTING PROCESS WITH SMALL MEMORY CAPACITY

BACKGROUND OF THE INVENTION

1. Field of the Invention

The present invention relates to technique of an error correction processing, and more particularly to a method and system for performing error detecting and correcting process with a memory having a small memory capacity for a system for multiplexing FM sound broadcasting with a subcarrier data channel, for example, a mobile receiving type FM multiplex broadcasting of a DARC (Data Radio Channel) system.

2. Description of the Related Art

In an FM multiplex broadcasting system, there are known three systems: a DARC (Data Radio Channel) system which is the standard system in Japan, a portable receiving system and a RDS (Radio Data System) which is developed in Europe and is adopted as the international standard system. Error correction codes are different from each other between the three systems. As the error correction code, the DARC system uses a product code of a (272, 190) code, the portable receiving system uses the (272, 190) code, and the RDS uses a (26, 16) code.

In the product code, error correction codes are added to data bits in both of a column direction and a row direction to allow error correction in both of the column direction and the row direction. In the DARC system, 272 data blocks are set as the one frame data, and each data block is composed of a data section of 190 bits including CRC and a parity section of 82 bits. One data block is transmitted during about 18 ms. In accordance with, the time which is required to transmit one frame data is about 5 seconds. This one frame data forms the product code of the (272, 190) code.

Next, the structure of the frame format B used in the DARC system as a frist conventional example is shown in FIGS. 3A and 3B. In this frame format, the frame data is transmitted in the data form in which a parity block is interleaved between the data blocks. In accordance with, when the error correction of the column direction is performed actually, it is necessary for the transmission frame data to be set in the state in which this interleaving state is eliminated. In other words, the transmission frame data is necessary to be converted into a data format of a data section of 190 blocks from the head of the frame data and a parity data section of 82 blocks subsequent to the data section.

The conventional error correcting operation using the product code of the (272, 190) code will be described below.

A conventional error correction processing system is composed of a data inputting section, an error detecting and correcting section and a frame memory unit. The data inputting section receives and outputs the data blocks each having 272 bits including an error correction code data.

The error detecting and correcting section inputs the data blocks to perform an error detecting and correcting process, and outputs the data block to which the error correction has been performed if the error correction is possible. Also, the error detecting and correcting section outputs an error signal and the data block to which the error correction has been performed if the error correction is impossible. The frame memory unit inputs and stores the data block which is outputted from the error detecting and correcting section.

The error detecting and correcting process will be described with reference to FIGS. 1A to 1C. First, the data block of 272 bits is inputted to the data input section and then is transferred to the error detecting and correcting section in step S102. In the error detecting and correcting section, an error detecting and correcting process (to be simply referred to as an "error correcting process" hereinafter) is performed to the transferred data block in a step S104. If any error is not detected in a step S106, the data block is determined to be a correct data and the data block is outputted to and stored in the frame memory unit in a step S114. Also, when any error is detected in the step S106, the error correcting process is performed in the error correcting section in a step S108. As a result, a data block after the error correcting process is outputted to and stored in the frame memory unit in the step S144. At this time, the error signal is set to be "affirmative", if there is any error in the data block after the error correcting process, and also is set to be "negative" if there is not any error.

The above-mentioned error correcting process is performed 272 times, and the frame data after the error correcting process for one frame, i.e., the 272 data blocks is stored in the frame memory which is shown in FIGS. 3A and 3B. FIG. 2A shows an example of the frame data after the error correcting process, and a "●" symbol shows an error bit position in FIG. 2A. The first error correcting process in the row direction for one frame is ended with the above process.

Next, the error correcting process in the column direction of the frame memory is performed. FIG. 1B shows a flow chart illustrating the error correcting process in the column direction.

The data block of 272 bits in the column direction is transferred to the error detecting and correcting section. Then, the error correcting process in the column direction is performed as in the error correcting process in the row direction, as shown in FIG. 1A.

The error correcting process in the column direction is performed 272 times. Then, the data after the first error correcting process in the row detection and the error correcting process in the column direction are performed to the frame data for one frame, i.e., 272 data blocks is stored in the frame memory.

FIG. 2B shows the result of the first error correcting process in the row detection and the error correcting process. A "○" symbol of FIG. 2B shows the bit which is corrected by the error correcting process in the column direction. Also, the "●" symbol shows the error bit after the first error correcting process in the row direction and the error correcting process in the column direction are performed.

Further, the second error correcting process in the row direction is performed to the frame data stored in the frame memory after the error correcting process in the column direction. The operation will be described with reference to a flow chart of FIG. 1C. The data block of 272 bits in the row direction is transferred from the frame memory unit to the error detecting and correcting section. Then, the second error correcting process is performed in the row direction, as in the first error correcting process in the row direction shown in FIG. 1A.

The second error correcting process in the row direction is performed 272 times. Then, data after the first error correcting process in the row direction, the error correcting process in the column direction and the second error correcting process in the row direction have been performed is stored in the frame memory, as shown in FIG. 2C. FIG. 2C shows an example of the frame data after the first and second error correcting processes in the row direction and the error correcting process in the column direction. The "●" symbol shows the error bit after the first error detecting and correcting process in the row direction, the error correcting process in the column direction and the second error correcting process in the row direction. Also, the "○", symbol shows the bit which is corrected by the second error correcting process in the row direction.

The above-mentioned processing is the contents of the error correcting process to the one frame data in the conventional error correcting system.

In this case, the frame memory is divided into two section, i.e., a frame memory A and a frame memory B, as shown in FIGS. 3A and 3B. The frame memory has a memory capacity for two frame data, i.e. about 18 Kbytes. A data section of 190 data blocks from the head of the frame data and a parity section of 82 blocks subsequent to the data section are arranged in each of the frame memories A and B.

After the 272 data blocks for one frame are stored in the frame memory A, the 272 data blocks for the next frame starts to be stored in the frame memory B. At this time, before the entire frame data of the 272 data blocks for the next frame are completely stored in the frame memory B, the error correcting process in the row direction and the second error correcting process in the column direction to the frame data of 272 data blocks which has been stored in the frame memory A must be completed. In accordance with, until the frame data for the next frame is stored, the first error correcting process in the row direction is performed 272 times, the error correcting process in the column direction is performed 272 times, and the second error correcting process in the row direction is performed 190 times. That is, it is totally 734 times. These processes are alternately performed to the frame memory A and the frame memory B.

As mentioned above, in the conventional error correcting system, the first error correcting process in the row direction is performed every time one data block is received. The interleaving state of the parity block is canceled after the first error correcting process and is stored in the frame memory. When data for one frame after the first error correcting process in the row direction is stored in the frame memory, the error correcting process in the column direction is performed to the frame data of 272 data blocks. Further, the second error correcting process in the row direction is performed to the frame data of 190 data blocks. In this case, because the remaining 82 data blocks are a parity section, the second error correcting process in the row direction is not needed.

In this case, during the execution of the error correcting process in the column direction to the frame data stored in the frame memory A, the first error correcting process in the row direction is performed to each data block of the frame data for the next frame. Also, the canceling process of the interleaving, and then the storing process in the frame memory B are performed to each data block of the frame data for the next frame. However, to simplify the control of access to the frame memory, another frame memory for one frame is needed in the conventional error correcting system.

The frame memory capacity for one frame is about 9 Kbytes. Since the frame memories for two frames becomes necessary, the frame memory capacity becomes about 18 Kbytes in the conventional error correcting system.

Also, since the error correcting process is performed by peripheral hardware built in a microcomputer, there is a problem in that the influence to a chip size can not be avoided because of the memory capacity of 18 Kbytes, if a frame memory is further built in the microcomputer.

In addition, an error correcting decoding circuit is described in Japanese Examined Patent Application (JP-B-Heisei 1-55788). In this reference, the error correcting decoding circuit is composed of designating and inputting means, a data register, a majority determining circuit, loading means and an output data selecting circuit. The designating and inputting means designates to reduces a (l, k) code to (k−n) bits, wherein the (l, k) code having k data bits and (l-k) parity bits and n is the number of bits of "0",. The m-bit data register has a plurality of output bits and m is equal to or smaller than k. The loading means loads the (k−n) data bits before correction to the m-bit data register based on the designation of the designating and inputting means. The output data selecting circuit selects and outputs one from among the output bits of the m-bit data register based on a signal from the designating and inputting means. Thus, an error of code data is corrected based on a majority determining error correcting system using a difference set cyclic code.

An error correcting decoding system is described in Japanese Examined Patent Application (JP-B-Heisei 2-11184). In this reference, the error correcting decoding system includes a majority determining circuit using a majority determining difference set cyclic code, a syndrome register and a data register. A subtracting circuit is added to the majority determining circuit. A determination threshold value of the majority determining circuit is set to a specific value which is within the number of input elements of the majority determining circuit. A specific number is sequentially subtracted from the determination threshold value via the subtracting circuit until the determination threshold value reaches the specific value, to correct and decode data.

An error correcting decoding system is described in Japanese Examined Patent Application (JP-B-Heisei 3-76612). In this reference, a packet of 272 bits is formed from a majority determining difference set cyclic code using 273 data bits, 191 information bits and 82 parity bits. A data signal is formed of 272 data bits, 190 information bits and 82 parity bits. Correction is performed based on the output state of the syndrome register for the data signal. A head bit is shifted to perform the correction again only when the syndrome register is all set to 0 after the correction. Thus, the probability that more than 9 error bits are corrected for one packet is increased.

SUMMARY OF THE INVENTION

The present invention is accomplished to the above problems. Therefore, an object of the present invention is to provide a method and system for correcting an error of a frame data received continuously by use of a frame memory unit having a small memory capacity.

In order to achieve an aspect of the present invention, an error correcting system includes a data supplying unit for continuously supplying a subframe data corresponding to a half of each of frames, wherein a frame data for one frame is formed of bit data of N rows and N columns and the subframe data is formed of bit data of N/2 rows and N columns and is composed of a data section and an error correction code section for the data section, a frame memory unit including first to third subframe memories, and an error detecting/correcting unit for storing the subframe data, which is supplied continuously from the data supplying unit and which is subjected to a first row direction error correcting process, in the first to third subframe memories sequentially and circularly among the first to third subframe memories, for performing a column direction error correcting process to first and second subframe data respectively stored in the first and second subframe memories as first and second halves of a first frame data, and then performing a second row direction error correcting process to a part of the first subframe data stored in the first subframe memory, while performing the first row direction error correcting process to a third subframe data as a first half of a second frame data to store in the third subframe memory, and for performing the second row direction error correcting process to a remaining part of the first subframe data and the second subframe data, while performing the first row direction error correcting process to a fourth subframe data as a second half of the second frame data to store in the first subframe memory from a head location.

In this case, each of the first row direction error correcting process and the column direction error correcting process is performed to the subframe data and the second row direction error correcting process is performed to the data section of the subframe data. Also, each of the first and second row direction error correcting processes is performed in units of rows. The column direction error correcting processes is performed in unit of a predetermined number of columns.

The error correction code section may include parity check codes. Further, the error correction code section may include the (272, 190) shortened majority decordable difference set cyclic code.

The frame memory unit has a memory capacity of 1.5 times of a size of the frame data.

The frame data may be a frame data of a data radio channel (DARC) system in an FM multiplex broadcasting.

In order to achieve another aspect of the present invention, a method of correcting a data error in an error correcting system, wherein a subframe data is continuously supplied in correspondence to a half of each of frames, a frame data for one frame is formed of bit data of N rows and N columns and the subframe data is formed of bit data of N/2 rows and N columns and is composed of a data section and an error correction code section for the data section, includes the steps of:

(a) storing a first subframe data, which is subjected to a first row direction error correcting process, in a first one selected sequentially and circularly from among three subframe memories;

(b) storing a second subframe data, which is subjected to the first row direction error correcting process, in a second one selected sequentially and circularly from among the three subframe memories;

(c) performing a column direction error correcting process to the first and second subframe data respectively stored in the first and second subframe memories as first and second halves of a first frame data, while performing the first row direction error correcting process to a part of a third subframe data as a first half of a second frame data to store in a third one selected sequentially and circularly from among the three subframe memories;

(d) performing a second row direction error correcting process to a part of the first subframe data stored in the first subframe memory, while performing the first row direction error correcting process to a remaining part of the third subframe data to store in the third subframe memory; and (e) performing the second row direction error correcting process to a remaining part of the first subframe data and the second subframe data, while performing the first row direction error correcting process to a fourth subframe data as a second half of the second frame data to store in the first subframe memory from a head location.

BRIEF DESCRIPTION OF THE DRAWINGS

FIGS. 3A and 3B are diagrams illustrating the structure in a frame memory in the conventional error correcting system;

FIG. 4 is a diagram illustrating the frame data structure of the frame format B of in an FM multiplex broadcasting system of a DARC system;

FIG. 6 is a diagram illustrating the structure of a frame memory unit of the error correcting system of the present invention;

FIGS. 7A to 7C are diagrams illustrating the states of the frame memory in the error correcting system of the present invention when subframe data for one frame to which the first error correcting process in the row direction have been performed are stored in the frame memory;

FIGS. 8A to 8C are diagrams illustrating the states of the frame memory in the error correcting system of the present invention when the error correcting process in a column direction is performed;

FIGS. 9A to 9C are diagrams illustrating the states of the frame memory in the error correcting system of the present invention when the second error correcting process in the row direction is performed to the subframe data stored in a subframe memory A while a subframe data as a second half of the next frame data is stored in the subframe memory A;

FIGS. 10A to 10C are diagrams illustrating the states of the frame memory in the error correcting system of the present invention when the second error correcting process in the row direction is performed to the subframe data stored in a subframe memory B while the subframe data as the second half of the next frame data is stored in the subframe memory A.

DESCRIPTION OF THE PREFERRED EMBODIMENTS

Next, an error correcting system of the present invention will be described with reference to the attached drawings.

Figure 1A:
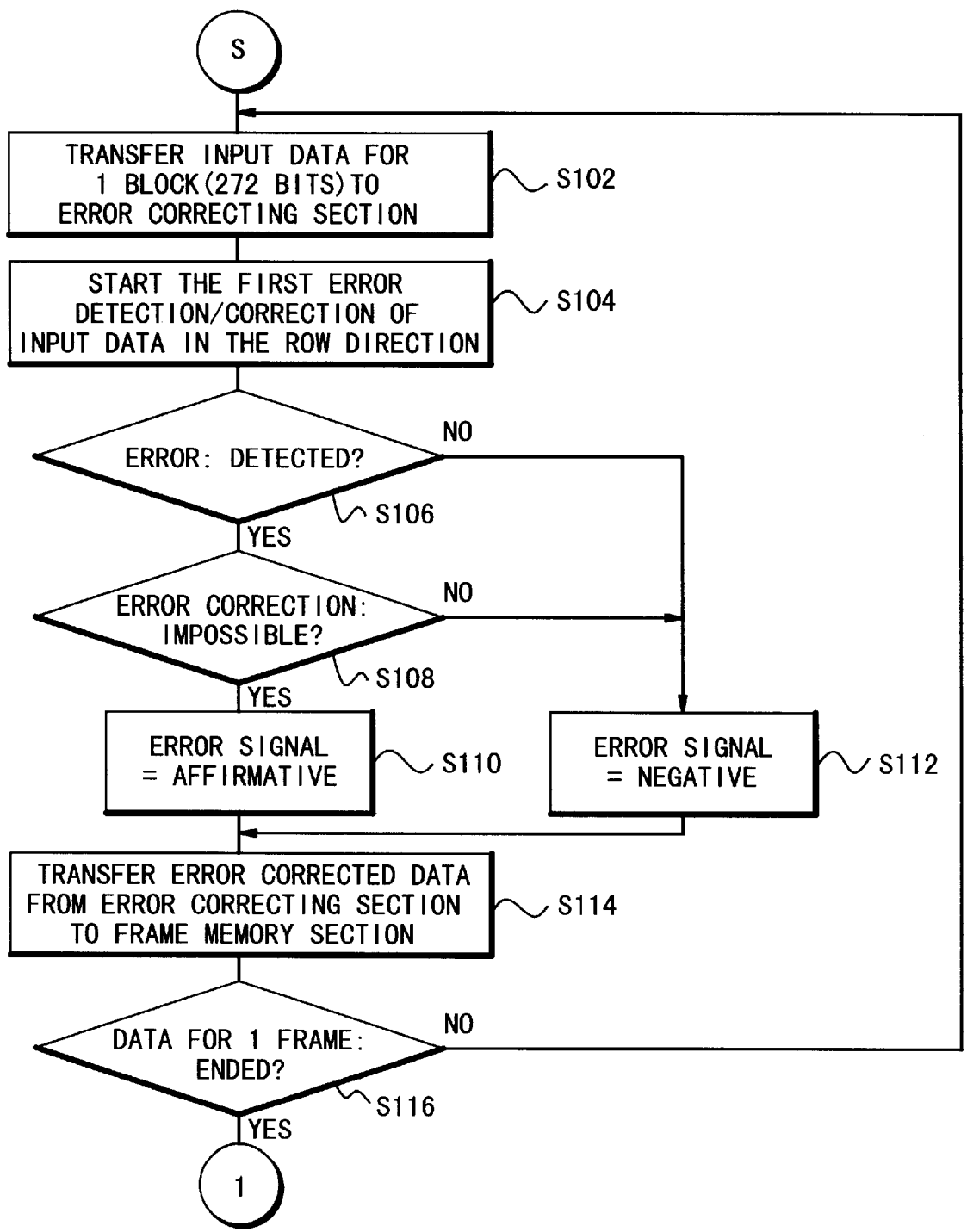
FIG. 1A is a flow chart to describe a first error detecting and correcting process in a row direction in a conventional error correcting system.
Figure 1B:
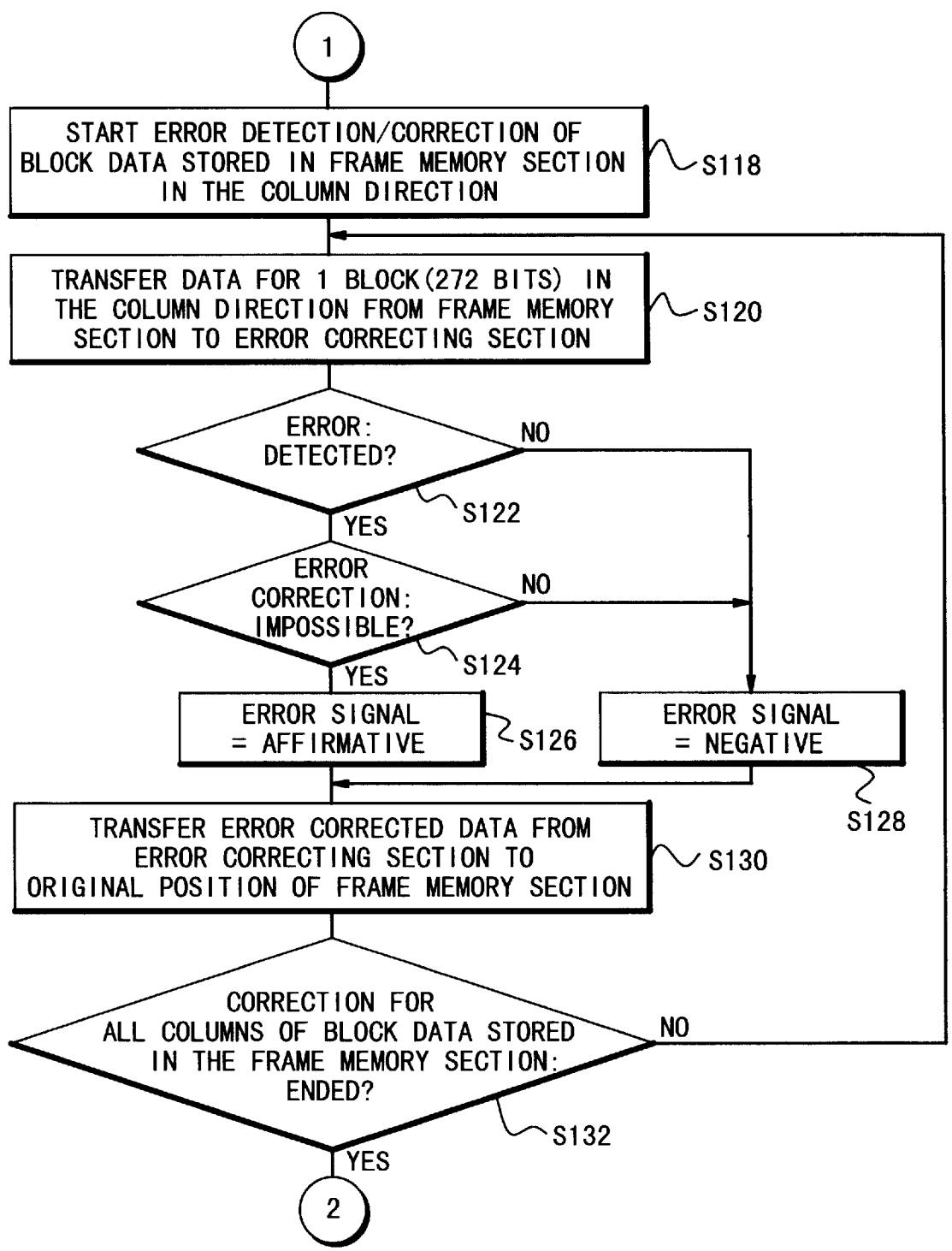
FIG. 1B is a flow chart to describe an error detecting and correcting process in a column direction in the conventional error correcting system.
Figure 1C:
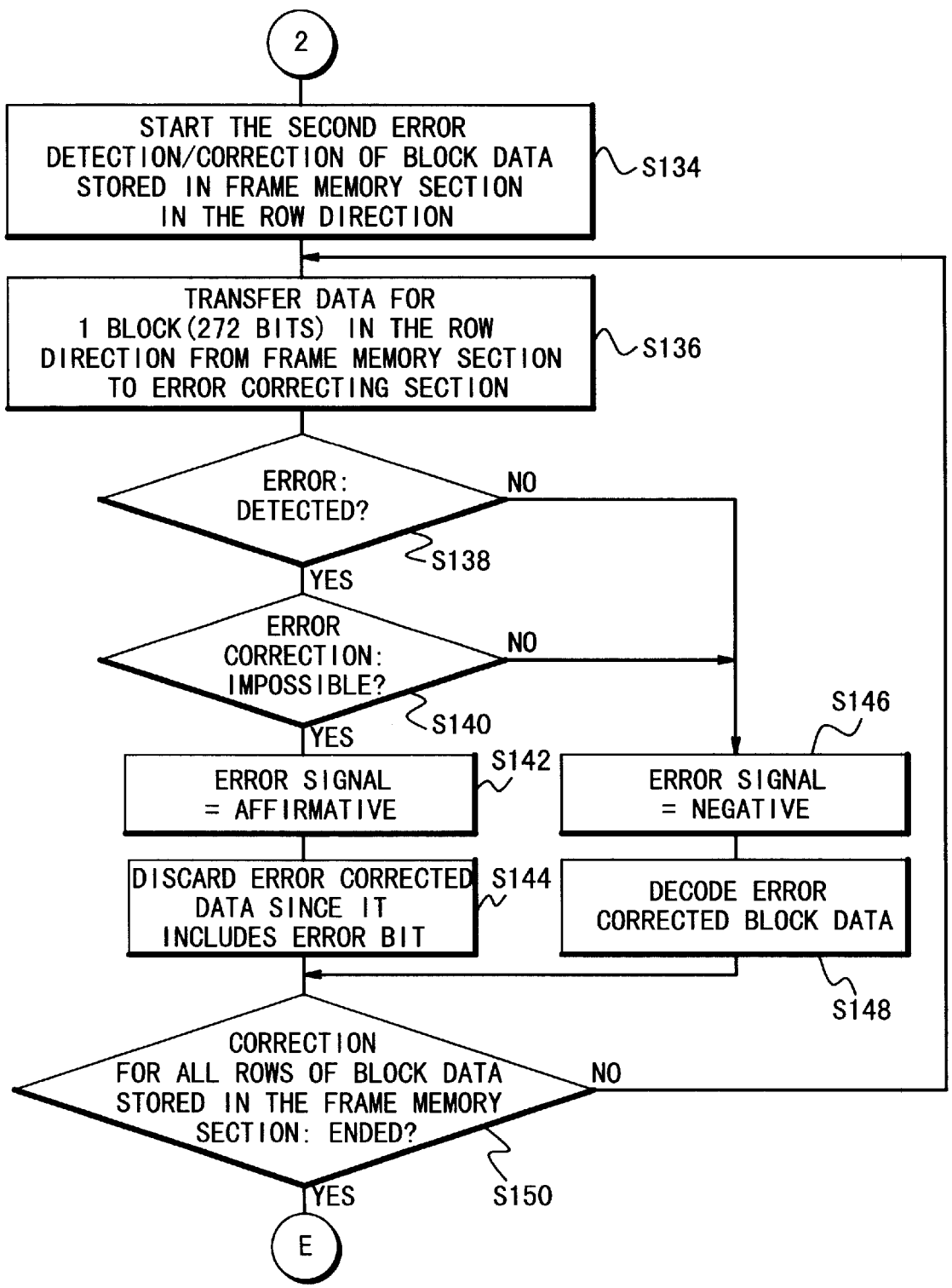
FIG. 1C is a flow chart to describe a second error detecting and correcting process in the row direction in the conventional error correcting system.
Figure 2A:
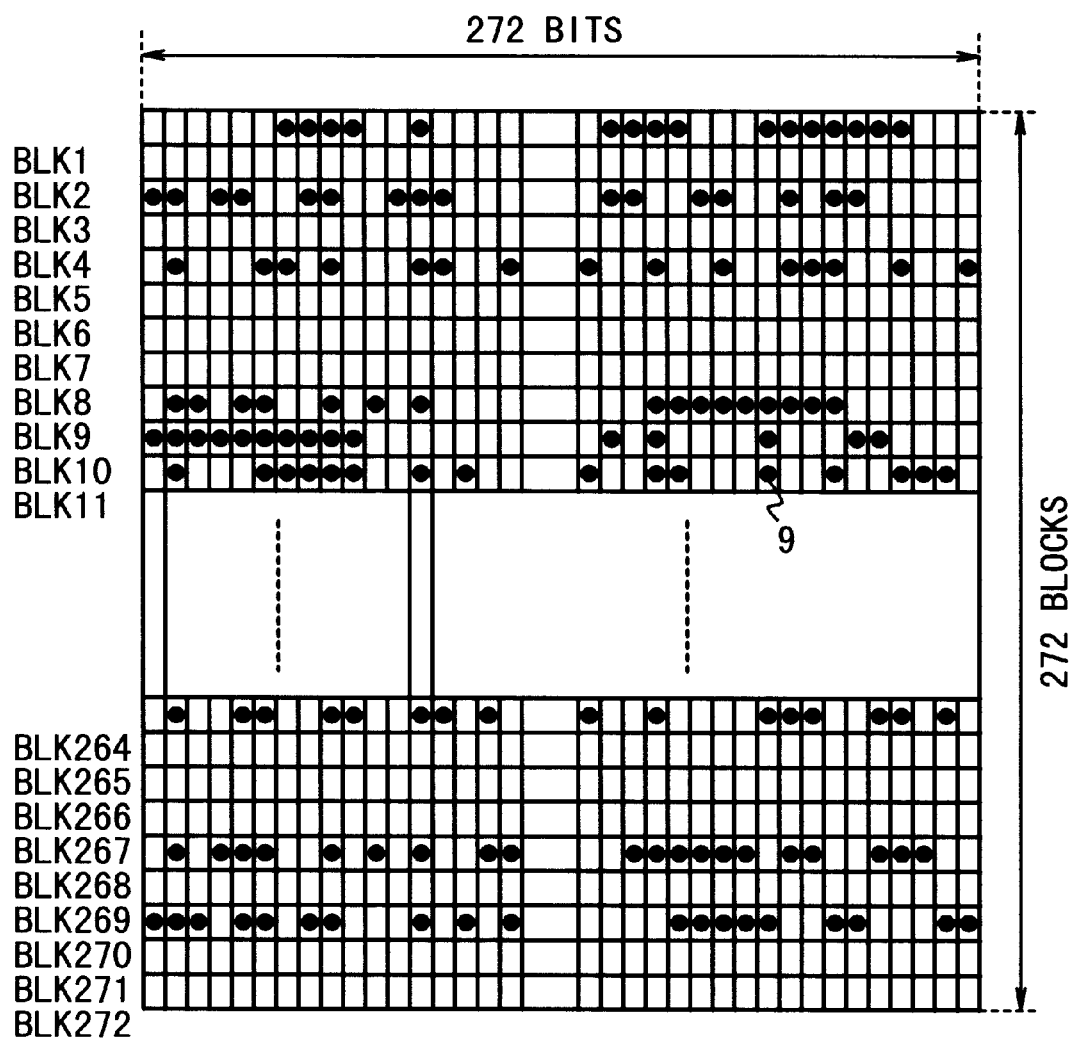
FIG. 2A is a diagram illustrating an example of the frame data after the first error detecting and correcting process in the row direction shown in FIG. 1A in the conventional error correcting system.
Figure 2B:
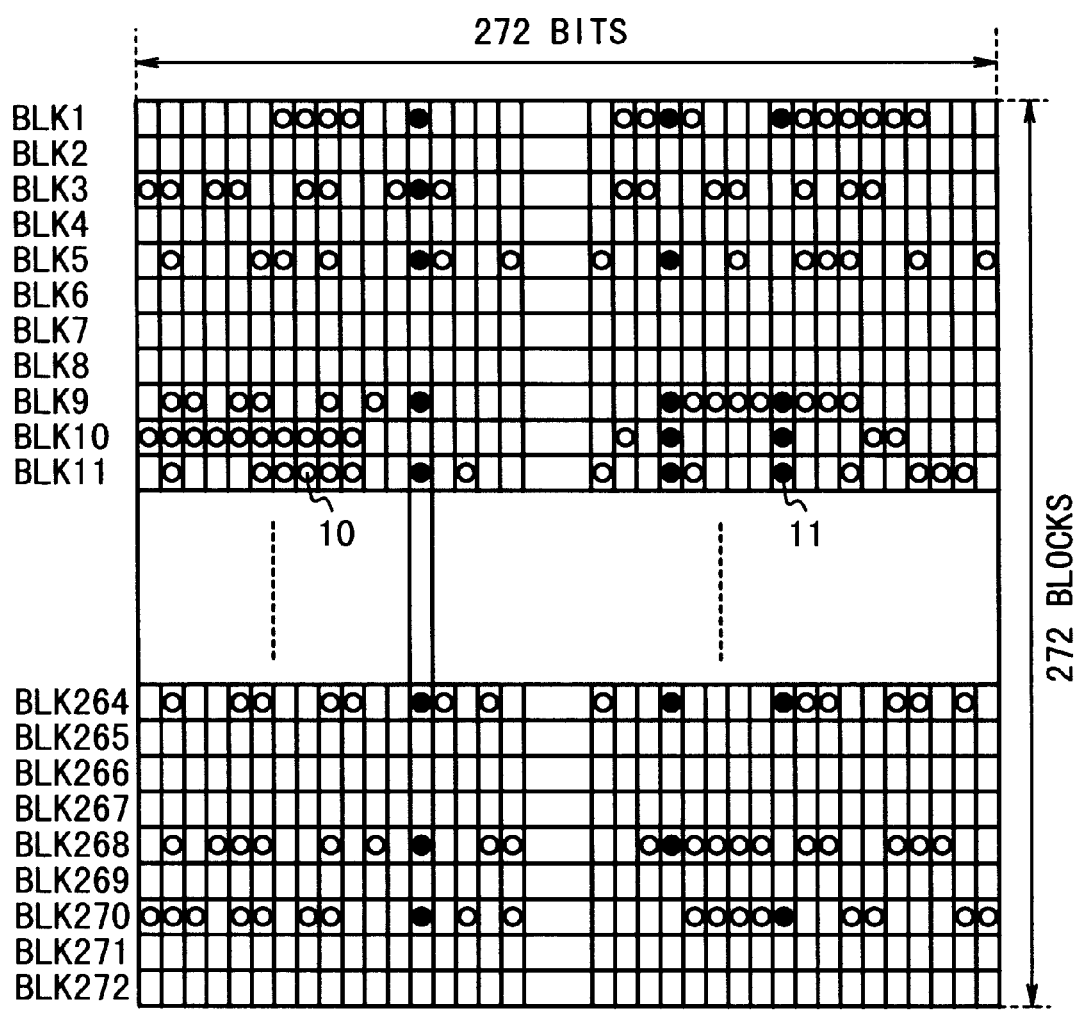
FIG. 2B is a diagram illustrating an example of the frame data after the error detecting and correcting process in the column direction shown in FIG. 1B in the conventional error correcting system.
Figure 2C:
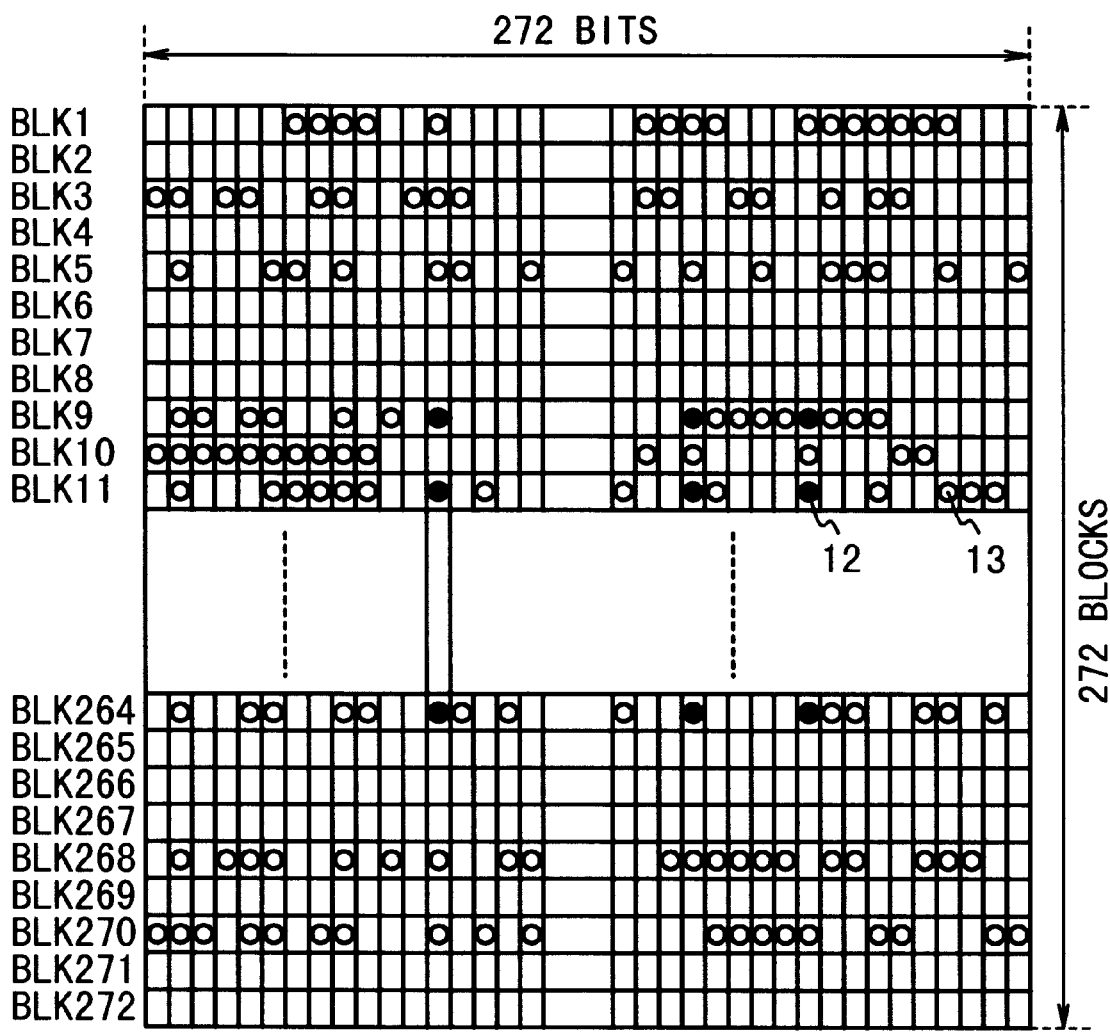
FIG. 2C is a diagram illustrating an example of the frame data after the second error detecting and correcting process in the row direction shown in FIG. 1C in the conventional error correcting system.
Figure 5:
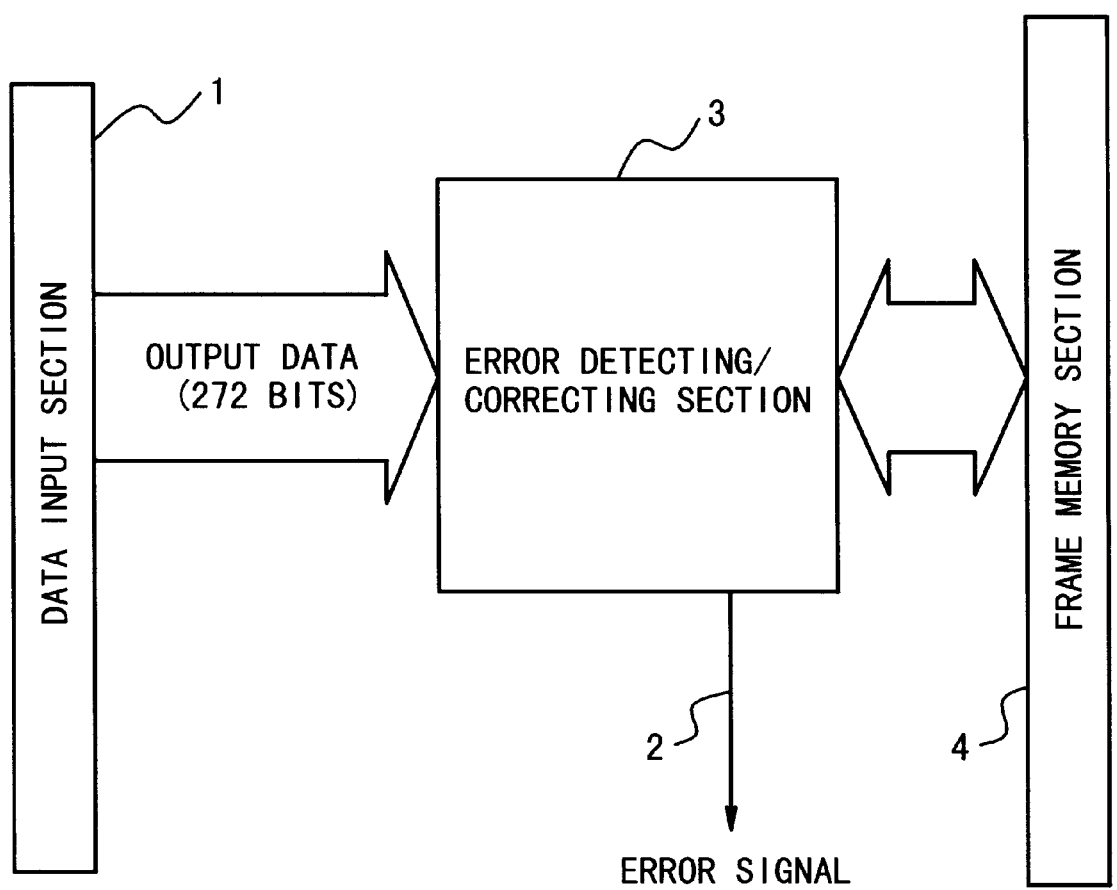
FIG. 5 is a block diagram illustrating the structure of an error correcting system of the present invention.

FIG. 5 is a block diagram illustrating the structure of the error correction processing system according to an embodiment of the present invention. Referring to FIG. 5, this error correcting process system is composed of a data inputting section 1, an error correcting section 3 and a frame memory section 4. The data inputting section 1 receives and outputs, as one data block, data blocks each having 272 bits containing an error correction data. The error correcting section 3 inputs the data block and performs an error correcting process. The error correcting section 3 outputs the data block to which the error correcting process has been performed if it is possible to correct the data block. Also, the error correcting section 3 outputs an error signal 2 and the data block to which the error correcting process has been performed if it is impossible to correct data block. The frame memory unit 4 temporarily stores the data blocks for the following error correcting process in a column direction and second error correcting process in a row direction.

Next, the operation of the error correcting system in the this embodiment will be described with reference to the diagram illustrating the structure of the frame memory unit 4 of FIG. 6 and the diagram illustrating the state change of subframe memories of FIGS. 7A to 10C.

Referring to FIG. 6, the frame memory unit 4 is divided into three section, i.e., a first subframe memory A, a second subframe memory B and a third subframe memory C, each of which stores a subframe data as a half of the frame data. The frame memory capacity is the capacity for 1.5 frames, i.e., about 13.5 Kbytes. This value is small, comparing with the conventional error correcting system. 95 data blocks are stored in each of the first, second and third subframe memories A, B and C from the head portion. Each data block is composed of 272 bits. Subsequently, 41 parity blocks are stored. The parity block stores parity check codes. Instead, (272, 190) shortened majority logic decordable difference set cyclic code may be used.

The error correcting process which is performed during the reception period of the one data block is classified into the following two patterns. That is, in the one pattern, the first error correcting process in the row direction is performed to the one data block and the error correcting process in the column direction is performed to the four blocks. In the other pattern, the first error correction process in the row direction is performed to the one block and the second error correcting process in the row direction is performed to one data block.

Next, the state change of the frame memory will be described with reference to FIGS. 7A to 10C. The frame data is, for example, a frame data of an FM multiplexing broadcasting of a DARC (data radio channel) system.

FIGS. 7A and 7B show the state in which the first and second halves of the frame data of 272 data blocks of a frame of No. 1, i.e., two subframe data are stored in the first and second subframe memories A and B. In this case, each of the data blocks is received from the data input unit 1 and is subjected to the first error correcting process in the row direction. Then, the data block is stored in the subframe memory. The content of the first error correcting process in the row direction is the same as that of the first conventional example. Also, when data blocks of the parity section are interleaved in the data section, the interleaving state of the parity section is eliminated so that the data blocks of the parity section are stored in the subframe memory from the block No. 96.

The third subframe memory C is empty or has a data which may be deleted. In this example, the processed data block of the first subframe data as the first half of the frame data for the frame No. 1 is stored in the subframe memory A. The processed data block of the second subframe data as the second half of the frame data for the frame No. 1 is stored in the subframe memory B. Of course, until the subframe data for one frame are stored in the first and second subframe memories A and B, the error correcting process in the column direction cannot be performed.

Next, as shown in FIGS. 8A to 8C, the error correcting process in the column direction is started when the subframe data for one frame are stored in the first and second subframe memories A and B. At this time, a third subframe data as the first half of the frame data of the frame of No. 2 starts to be stored in the subframe memory C. The error correcting process in the column direction is performed in unit of four data block in the row direction in this example. The error correcting process in the column direction is performed to all of the data blocks stored in the first and second subframe memories A and B. AT this time, because each data block of the first and second subframe data has 272 bits, 69 data blocks of the third subframe data have been stored in the third subframe memory C, as shown in FIG. 8C. In this case, if the parity data block is interleaved in the data section, the interleaving is canceled and the parity data block is stored in the parity section of the subframe memory C.

After the error correcting process in the column direction to the first subframe data is completed, the second error correcting process in the row direction to the first subframe data is started. As shown in FIG. 9C, 67 (=136–69) data blocks of the third subframe data are already stored in the subframe memory C. When the remaining 67 data blocks are stored in the third frame memory C, the second error correcting process in the row direction is completed for the data blocks from the data block of No. 1 to the data block of No. 67 in the first subframe data, as shown in FIG. 9A. At this time, each of the 67 data blocks is read from the first subframe memory A and is subjected to the second error correcting process in the row direction. Therefore, the data blocks from the data block of No. 1 to the data block of No. 67 may be overwritten by another data blocks.

Next, since the 67 data blocks in the first subframe memory A are already subjected to the second error correcting process in the row direction, a fourth subframe data as the second half of the frame data for the next frame of No. 2 are stored in the blocks No. 1 to 67 of the first subframe memory A. While the fourth subframe data is stored in the subframe memory A as shown in FIG. 10A, the remaining data blocks of No. 68 to No. 95 of the first subframe memory A is read out and is subjected to the second error correcting process in the row direction. That is, when the 47 data blocks of the fourth subframe data are stored in the first subframe memory A, the remaining 47 data blocks of the first subframe data are read out and is subjected to the second error correcting process in the row direction. Thereafter, the second error correcting process in the row direction is performed to the second subframe data stored in the subframe memory B, as shown in FIG. 10B. When the second error correcting process in the row direction to the second subframe data is completed, the fourth subframe data is not yet fully stored in the first subframe memory A. As shown in FIG. 10A by ③, 13 data blocks are remained without storage of the data blocks of the fourth subframe data. Subsequently, these data blocks are stored in the first subframe memory A.

In this state, the fourth subframe data which has been subjected to the first error correcting process in the row direction is stored in the first subframe memory A. The second subframe data which has been subjected to the second error correcting process in the row direction is stored in the second subframe memory B. The third subframe data which has been subjected to the first error correcting process in the row direction is stored in the third subframe memory A. Therefore, the error correcting process in the column direction can be applied to the third and fourth subframe data as the first and second halves of the frame data of the frame No. 2.

In this manner, the above-mentioned processes are repeated for the frame data or subframe data continuously supplied from the data input unit 1.

Figure 11:
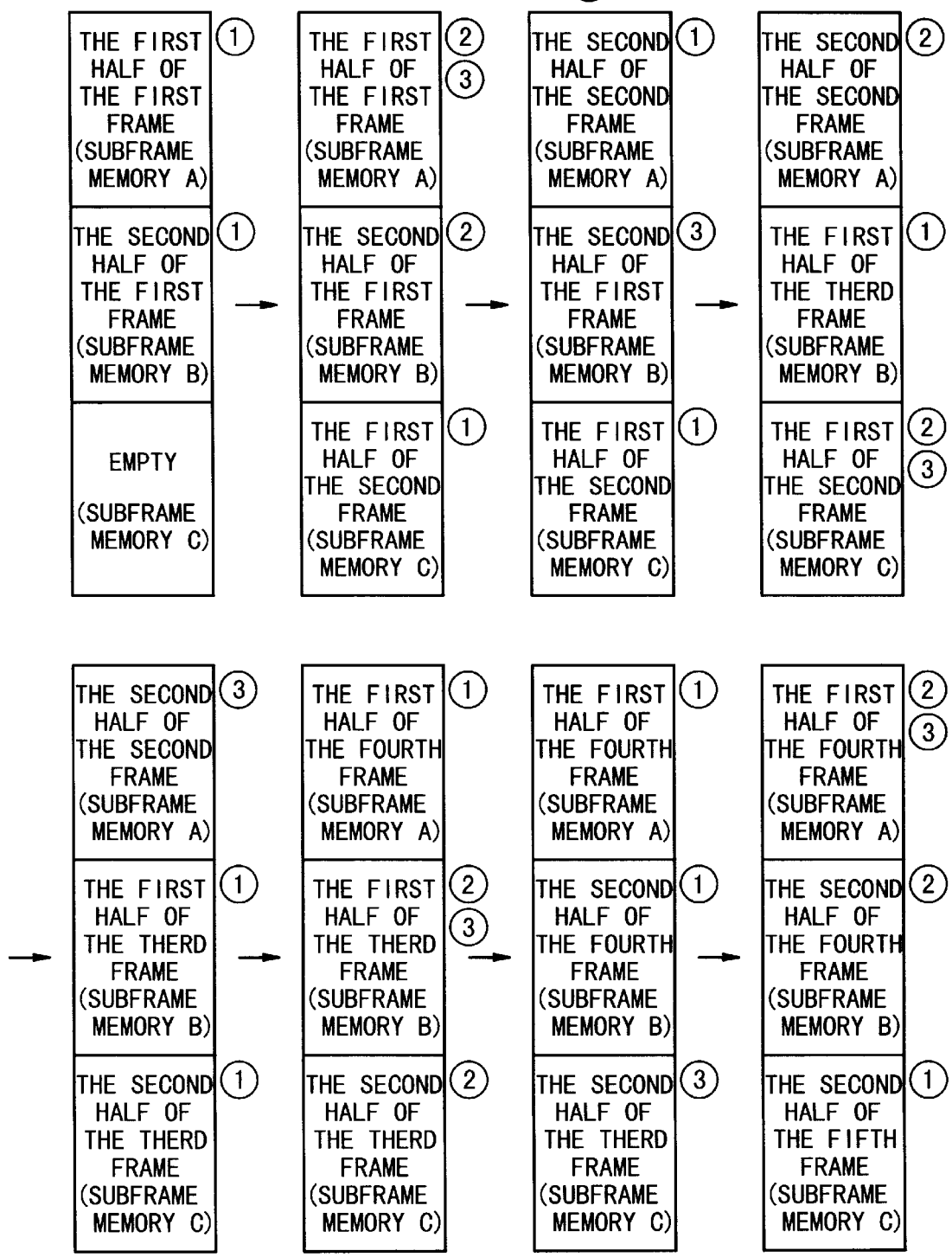
FIG. 11 is a diagram illustrating state change of each of the subframe memories in the error correcting system of the present invention.

FIG. 11 shows the storage state change of the first, second and third subframe memories A, B and C. In FIG. 11, ① indicates the result of the first error correcting process in the row direction, ② indicates the result of the error correcting process in the column direction, and ③ the second error correcting process in the row direction. As shown in FIG. 11, the a first subframe data is subjected to the first error correcting process in the row direction and is stored in the first subframe memory. Then, a second subframe data is subjected to the first error correcting process in the row direction and is stored in the second subframe memory. Subsequently, the error correcting process in the column direction performed to the first and second subframe data respectively stored in the first and second subframe memories, while a part of a third subframe data as a first half of a second frame data is subjected to the first error correcting process in the row direction and is stored in the third subframe memory. At this time, the second error correcting process in the row direction is performed to a part of the first subframe data stored in the first subframe memory, while the first error correcting process in the row direction is performed to a remaining part of the third subframe data to store in the third subframe memory. The second error correcting process in the row direction is performed to a remaining part of the first subframe data and the second subframe data, while the first error correcting process in the row direction is performed to a fourth subframe data as a second half of the second frame data which is stored in the first subframe memory from a head location.

As described above, there is a difference between the conventional processing and the processing of a present invention in the method of storage of data blocks in the subframe memories. However, the error correcting process is performed during the reception period of one frame data a same number of times. In accordance with, the present invention has the same error correcting process ability as the conventional error correcting system.

In the field except the FM multiplex broadcasting, the present invention can be also applied sufficiently to the field which uses an error correcting system by the product code.

As described above, according to the present invention, the frame memory is divided into subframe memories A, B, C. Also, the subframe data has the structure in which the subframe data is divided into a data section and a parity section subsequent to the data section. The error correcting process in the column direction to the 272 data blocks for a previous frame, the column direction error correcting process to the 272 data blocks and the second error correcting process of the row direction to 67 blocks are performed while the frame data of the first half of the frame data for the current frame is received. Therefore, each data block of the second half of the frame data for the current frame can be stored in the area of the subframe memory in which the first half of the previous frame data is stored.

Also, the control and the management of the frame memories become simple. Therefore, the whole quantity of the frame memory can be reduced to the 1.5 frames.

What is claimed is:

1. An error correcting system comprising:
   a data supplying unit for continuously supplying a subframe data corresponding to a half of each of frames, wherein a frame data for one frame is formed of bit data of N rows and N columns and said subframe data is formed of bit data of N/2 rows and N columns and is composed of a data section and an error correction code section for said data section;
   a frame memory unit including first to third subframe memories; and;
   an error detecting/correcting unit for storing said subframe data, which is supplied continuously from said data supplying unit and which is subjected to a first row direction error detecting and correcting process, sequentially and circularly in said first to third subframe memories, for performing a column direction error detecting and correcting process to first and second subframe data respectively stored in said first and second subframe memories as first and second halves of a frame data for a first frame, and then performing a second row direction error detecting and correcting process to a part of said first subframe data stored in said first subframe memory, while said first row direction error detecting and correcting process is performed to a third subframe data as a first half of a frame data for a second frame to store in said third subframe memory, and for performing said second row direction error detecting and correcting process to a remaining part of said first subframe data and said second subframe data, while said first row direction error detecting and correcting process is performed to a fourth subframe data as a second half of the frame data for the second frame to store in said first subframe memory from a head location.

2. An error correcting system according to claim 1, wherein each of said first and second row direction error detecting and correcting processes is performed to said subframe data and said column direction error detecting and correcting process is performed to said data section of said subframe data based on said error correction code section of said subframe data.

3. An error correcting system according to claim 2, wherein each of said first and second row direction error detecting and correcting processes is performed in units of rows.

4. An error correcting system according to claim 2, wherein said column direction error detecting and correcting processes is performed in unit of a predetermined number of columns.

5. An error correcting system according to claim 2, wherein said error correction code section comprises a parity check code.

6. An error correcting system according to claim 2, wherein said error correction code section comprises a (272, 190) shortened majority logic decodable difference set cyclic code.

7. An error correcting system according to claim 1, wherein when rows of said error correction code section are interleaved, said error detecting/correcting unit eliminates an interleaving state of said error correction code section of said subframe data to store said subframe data in one of said first to third subframe memories to separate said data section from said error correction code section.

8. An error correcting system according to claim 1, wherein said frame memory unit has a memory capacity of 1.5 times of a size of said frame data.

9. An error correcting system according to claim 1, wherein said frame data is a frame data of a data radio channel (DARC) system in an FM multiplex broardcasting.

10. A method of correcting a data error in an error correcting system, wherein a subframe data is continuously supplied in correspondence to a half of each of frames, a frame data for one frame is formed of bit data of N rows and N columns and said subframe data is formed of bit data of N/2 rows and N columns and is composed of a data section and an error correction code section for said data section, comprising the steps of:

(a) storing a first subframe data, which is subjected to a first row direction error correcting process, in a first one selected sequentially and circularly from among three subframe memories;

(b) storing a second subframe data, which is subjected to said first row direction error detecting and correcting process, in a second one selected sequentially and circularly from among said three subframe memories, after said step (a);

(c) performing a column direction error detecting and correcting process to said first and second subframe data respectively stored in said first and second subframe memories as first and second halves of a frame data for a first frame, while performing said first row direction error detecting and correcting process to a part of a third subframe data as a first half of the frame data for a second frame to store in a third one selected sequentially and circularly from among said three subframe memories;

(d) performing a second row direction error detecting and correcting process to a part of said first subframe data stored in said first subframe memory, while performing said first row direction error detecting and correcting process to a remaining part of said third subframe data to store in said third subframe memory; and (e) performing said second row direction error detecting and correcting process to a remaining part of said first subframe data and said second subframe data, while performing said first row direction error detecting and correcting process to a fourth subframe data as a second half of the frame data for the second frame to store in said first subframe memory from a head location.

11. A method according to claim 10, wherein each of said first and second row direction error detecting and correcting processes is performed to said subframe data and said column direction error detecting and correcting process is performed to said data section of said subframe data based on said error correction code section of said subframe data.

12. A method according to claim 11, wherein each of said first and second row direction error detecting and correcting processes is performed in units of rows.

13. A method according to claim 11, wherein said column direction error detecting and correcting processes is performed in unit of a predetermined number of columns.

14. A method according to claim 11, wherein when rows of said error correction code section are interleaved, said error detecting/correcting unit eliminates an interleaving state of said error correction code section of said subframe data to store said subframe data in one of said first to third subframe memories to separate said data section from said error correction code section.

15. A method according to claim 11, wherein said error correction code section comprises a parity check code.

16. A method according to claim 11, wherein said error correction code section comprises a (272, 190) shortened majority logic decordable difference set cyclic code.

17. A method according to claim 10, wherein said frame memory unit has a memory capacity of 1.5 times of a size of said frame data.

18. A method according to claim 10, wherein said frame data is a frame data of a data radio channel (DARC) system in an FM multiplex broadcasting.

* * * * *

UNITED STATES PATENT AND TRADEMARK OFFICE
CERTIFICATE OF CORRECTION

PATENT NO. : 6,101,625
DATED : August 8, 2000
INVENTOR(S) : K. Higashi

Page 1 of 1

It is certified that error appears in the above-identified patent and that said Letters Patent is hereby corrected as shown below:

Column 1,
Line 57: "The error…" should not begin a new paragraph.

Column 10,
Line 14, Claim 1: "and;" should read -- and --
Line 59, Claim 6: Delete -- decordable --

Column 12,
Line 32, Claim 16: Delete -- decordable --

Signed and Sealed this

Thirty-first Day of July, 2001

*Attest:*

*Attesting Officer*

NICHOLAS P. GODICI
*Acting Director of the United States Patent and Trademark Office*